United States Patent
Park et al.

(10) Patent No.: US 6,911,715 B2
(45) Date of Patent: Jun. 28, 2005

(54) BIPOLAR TRANSISTORS AND METHODS OF MANUFACTURING THE SAME

(75) Inventors: Chan-ho Park, Bucheon (KR); Jin-myung Kim, Incheon Metropolitan (KR); Kyeong-seok Park, Bucheon (KR); Dong-ho Hyun, Bucheon (KR)

(73) Assignee: Fairchild Korea Semiconductor Ltd, Bucheon (KR)

( * ) Notice: Subject to any disclaimer, the term of this patent is extended or adjusted under 35 U.S.C. 154(b) by 0 days.

(21) Appl. No.: 10/655,820

(22) Filed: Sep. 5, 2003

(65) Prior Publication Data

US 2004/0046186 A1 Mar. 11, 2004

(51) Int. Cl.$^7$ ............................................. H01L 27/082
(52) U.S. Cl. ..................... 257/565; 257/197; 257/273; 257/462; 257/517; 257/526; 257/556; 257/592; 438/189; 438/235; 438/309; 438/325; 438/350
(58) Field of Search .......................... 257/47, 197, 205, 257/273, 350, 361, 370, 378, 423, 462, 477–479, 511–518, 525, 526, 539–543, 552–593

(56) References Cited

U.S. PATENT DOCUMENTS

| 4,337,474 A | * | 6/1982 | Yukimoto | 257/493 |
| 4,996,581 A | * | 2/1991 | Hamasaki | 257/592 |
| 5,091,336 A | | 2/1992 | Beasom | 437/150 |
| 5,336,926 A | * | 8/1994 | Matthews | 257/657 |

OTHER PUBLICATIONS

Double Polysilicon—the technology behind silicon MMICs, RF transistors & PA modules; Philips Brochure; Fact Sheet NIJ004; 1998; 2 pgs.

Peter et al.; Selectively–Implanted Collector Profile Optimisation for High–Speed Vertical Bipolar Transistors; Philips Research Laboratories; 4 pgs.

* cited by examiner

*Primary Examiner*—Andy Huynh
(74) *Attorney, Agent, or Firm*—Kenneth E. Horton; Kirton & McConkie

(57) ABSTRACT

A bipolar transistor in which the occurrence of Kirk effect is suppressed when a high current is injected into the bipolar transistor and a method of fabricating the bipolar transistor are described. The bipolar transistor includes a first collector region of a first conductive type having high impurity concentration, a second collector region of a first conductive type which has high impurity concentration and is formed on the first collector region, a base region of a second conductive type being formed a predetermined portion of the second collector region, and an emitter region of a first conductive type being formed in the base region. The bipolar transistor further includes the third collector region, which has higher impurity concentration than the second collector region, at the bottom of the base region. Therefore, it is possible to prevent the base region from extending toward the second collector region due to the third collector region when a high current is injected into the bipolar transistor, thereby improving the capability of driving a current of the bipolar transistor and preventing the occurrence of Kirk effect even during the injection of a high current.

26 Claims, 5 Drawing Sheets

BIPOLAR TRANSISTORS AND METHODS OF MANUFACTURING THE SAME

REFERENCES TO RELATED APPLICATIONS

This application claims priority of Korean Patent Application No. 2002-53922, filed Sep. 6, 2002, the disclosure of which is incorporated herein by reference in its entirety.

FIELD OF THE INVENTION

The invention relates to bipolar transistors and method for manufacturing such transistors. More particularly, the invention relates to bipolar transistors capable of suppressing the occurrence of Kirk effect during the injection of high current, and methods for manufacturing such transistors.

BACKGROUND OF THE INVENTION

A bipolar transistor and a metal-oxide-silicon (MOS) transistor are types of semiconductor devices. The bipolar transistor is preferred to the MOS transistor because the bipolar transistor operates at a faster switching speed in a digital integrated circuit. The bipolar transistor also has a greater amount of driving current per unit area when compared with the MOS transistor.

FIG. 1 illustrates a cross-sectional view of a conventional NPN bipolar transistor. As depicted in FIG. 1, a collector region 10 of a high-concentration n type impurity (hereinafter, '$n^+$ type') is formed in a bottom portion of a substrate 15 of a low-concentration n type impurity (hereinafter, '$n^{31}$ type'). In the process of forming the $n^+$ type collector region 10, the substrate 15 becomes an $n^-$ type collection region.

Typically, p type impurities are implanted into and activated in the $n^-$ type collector region 15 to form a p type base region 20. As well, $n^+$ type impurities are usually implanted into and activated in a predetermined portion of the p-type base region 20 to form an $n^+$ type emitter region 25. After forming the emitter region 25, an insulating layer 30 is often formed to cover the tops of the base region 20 and the emitter region 25. Next, the insulating layer 30 is partially etched to expose predetermined portions of the base region 20 and the emitter region 25. After etching the insulating layer 30, a base electrode 35B and an emitter electrode 35E are formed to contact the exposed portions of the base region 20 and the emitter region 25. Also, a collector electrode 35C is usually formed at the bottom of the high-concentration n-type collector region 10 using any method known in the art.

However, it is known that a "Kirk effect" (where the effective base width of a bipolar transistor extends to a collector region) is caused in the bipolar transistor of FIG. 1 when a current higher than a predetermined level is injected into the bipolar transistor. The occurrence of the Kirk effect results in an increase in the effective base width and a reduction in a current gain of the transistor. Also, the number of carriers is increased in the effective base region, thereby lowering the operational speed of the bipolar transistor.

SUMMARY OF THE INVENTION

The present invention provides bipolar transistors where the occurrence of Kirk effect is suppressed when a high current is injected into the transistors.

The present invention also provides methods of manufacturing such bipolar transistors.

The present invention provides a bipolar transistor including a first collector region of a first conductive type having high impurity concentration, a second collector region of a first conductive type which has high impurity concentration and is formed on the first collector region, a base region of a second conductive type being formed a predetermined portion of the second collector region, and an emitter region of a first conductive type being formed in the base region. A third collector region can be further formed at an interface between the base region and the second collector region, the third collector region whose impurity concentration is higher than that of the second collector region. The impurity concentration of the third collector region can gradually decrease as the third collector region more closely approaches an interface between the third collector region and the base region to the second collector region. The third collector region can have a lower impurity concentration than the first collector region. The first collector region can have an impurity concentration from $10^{14}/cm^3$ to $10^{20}/cm^3$, the second collector region can have an impurity concentration from $10^{13}/cm^3$ to $10^{16}/cm^3$, and the third collector region can have an impurity concentration from $10^{14}/cm^3$ to $10^{17}/cm^3$. The bipolar transistor may further include a base electrode being formed in a predetermined portion of the base region so as to contact the base region, an emitter region being formed in a predetermined portion of the emitter region so as to contact the emitter region, and a collector electrode being formed at the bottom of the first collector region. The impurity concentrations of the base region, the emitter region, and the first collector region can gradually increase toward an interface between the base region and the base electrode, an interface between the emitter region and the emitter electrode, and an interface between the collector region and the collector electrode, respectively. The first conductive type can be an n type and the second conductive type can be a p type.

The present invention also provides a method of manufacturing a bipolar transistor by: forming a high-concentration first collector region of a first conductive type at the bottom of a semiconductor substrate that is doped with low-concentration impurities of a first conductive type, thereby defining a second collector region on the semiconductor substrate on the first collector region; implanting at least one of first conductive impurities for a third collector region and second conductive impurities for a base region into the second collector region; activating the first conductive impurities for the third collector region and the second conductive impurities for the base region, thereby forming the base region and the third collector region below the base region; and forming an emitter region in the base region. The third collector region can have a higher impurity concentration than the second collector region.

The first conductive impurities can be ion-implanted into the third collector region, so that the third collector region has lower impurity concentration than the first collector region. The first collector region and the emitter region can be obtained by ion-implanting corresponding impurities into the first collector region and the emitter region and activating the implanted impurities, respectively. After forming the emitter region, the method may further include: depositing an insulating layer on the semiconductor substrate on which the base region and the emitter region are formed; partially etching the insulating layer to expose predetermined portions of the base region and the emitter region; forming a base electrode and an emitter electrode on the exposed portions of the based region and the emitter region; and forming a collector electrode at the first collector region.

BRIEF DESCRIPTION OF THE DRAWINGS

The above aspects and advantages of the present invention will become more apparent by describing in detail the preferred aspects thereof with reference to the attached drawings in which:

FIGS. 1–4 illustrate specific aspects of the invention and are a part of the specification. Together with the following description, the Figures demonstrate and explain the principles of the invention. In the drawings, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same element, and thus their descriptions will not be repeated.

DETAILED DESCRIPTION OF THE INVENTION

The present invention will now be described more fully with reference to the accompanying drawings, in which preferred aspects of the invention are shown. This invention may, however, be embodied in many different forms and should not be construed as being limited to the aspects set forth herein. Rather, these aspects are provided so that this disclosure will be thorough and complete and will fully convey the concept of the invention to those skilled in the art. For example, the device and methods are described with respect to NPN transistor, but could be used to make PNP transistors.

Figure 1:
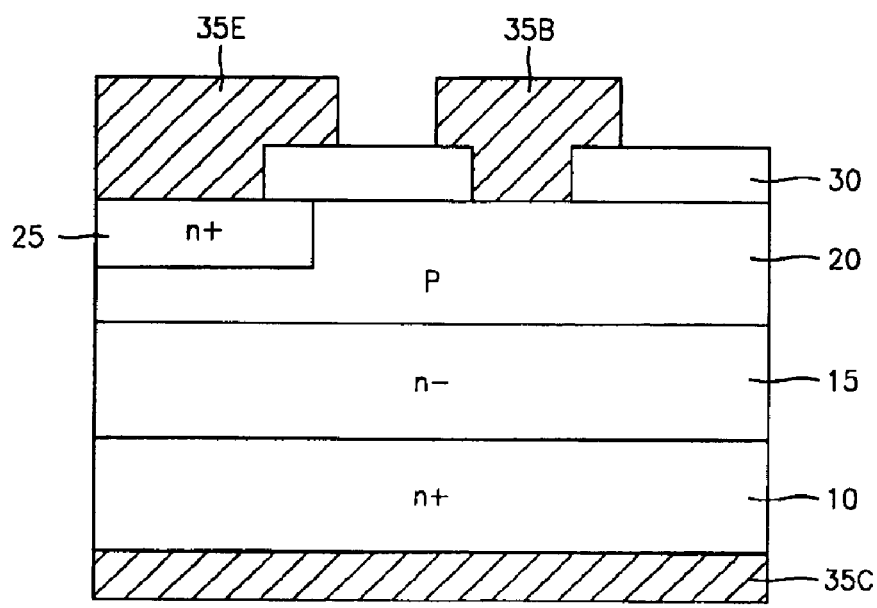
FIG. 1 illustrates a cross-sectional view of a conventional bipolar transistor.
Figure 2A:
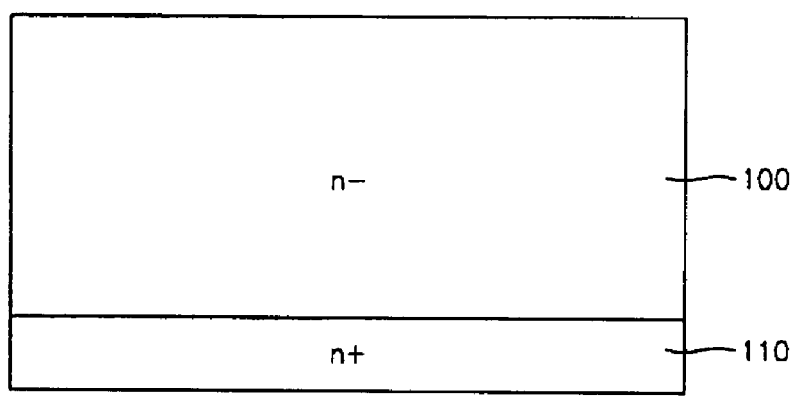
FIGS. 2A through 2E are cross-sectional views explaining a method of manufacturing a bipolar transistor in chronological order in one aspect of the present invention.

FIG. 2A illustrates a semiconductor substrate 100 in which a bipolar transistor is to be formed. The semiconductor substrate 100 may be any silicon substrate that is doped with n⁻ type impurities, such as phosphorous ions. The impurity concentration of the n⁻ type semiconductor substrate 100 may range from about $10^{13}$ atoms/cm³ to about $10^{16}$ atoms/cm³.

N⁺ type impurities are deeply implanted into and then activated in the n⁻ type semiconductor substrate 100 to form a first collector region 110 that is located below the semiconductor substrate 100. The first collector region 110 has a high density of impurities with a concentration of more than about $10^{14}$ atoms/cm³, and in one aspect of the invention, from about $10^{14}$ atoms/cm³ to about $10^{20}$ atoms/cm³. For instance, phosphorous ions (which are n type impurities) can be implanted into the semiconductor substrate 100 to form the first collection region 110.

The greater the depth of the semiconductor substrate 100, the higher the impurity concentration of the first collector region 110 should be. The required amount of ion injection energy for the collector region 110 can be adjusted and then injected into the semiconductor substrate 100 so that the first collector region 110 can be formed at the bottom of the semiconductor substrate 100. Since the first collector region 110 defines an n⁺ type impurity region in bottom portion of the semiconductor substrate 100, an n⁻ type impurity region is defined in the remainder of the substrate 100 and is referred to as a second collector region. The second collector region substantially corresponds to the semiconductor substrate 100 and, therefore, the second collector region will be also described with reference numeral 100.

Figure 2B:
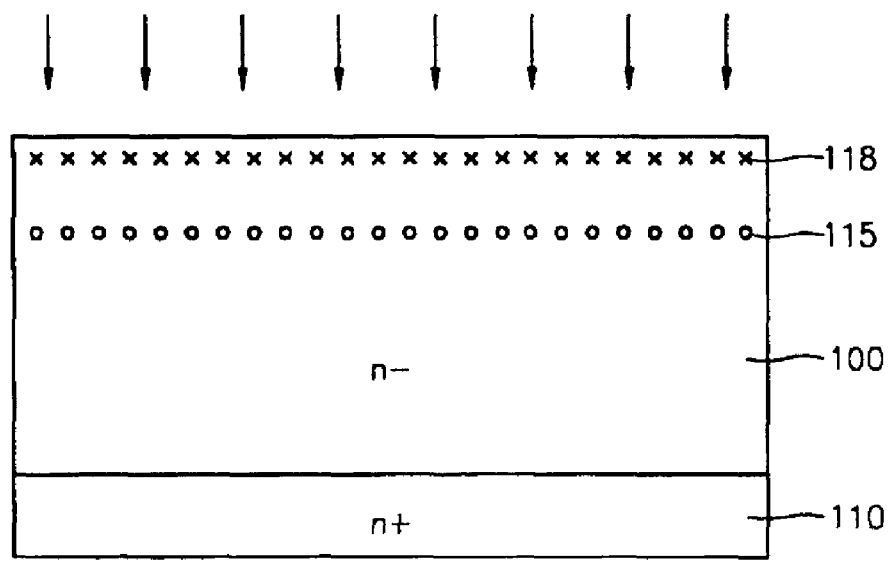

Next, as shown in FIG. 2B, n type impurities 115 and p type impurities 118 are implanted into the semiconductor substrate 100 (i.e., the second collector region). As described below, n type impurities 115 are used to form a third collector region (not shown in FIG. 2B) that prevents a base region (not shown in FIG. 2B) from extending to the second collector region 100. As well, p type impurities 118 are used to form the base region. In one aspect of the invention, the concentration of the n type impurities 115 is higher than the impurity concentration of the second collector region 100 and lower than the impurity concentration of the first collector region 110. The n type impurities 115 and the p type impurities 118 may be implanted into the semiconductor substrate 100 either sequentially or in the opposite order.

Figure 2C:
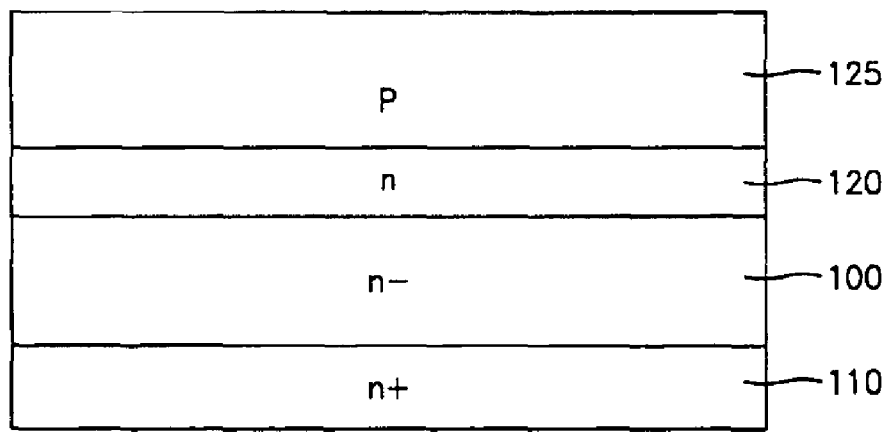

Next, as shown in FIG. 2C, the resulting structure is heated at a predetermined temperature to activate the ion-implanted n type impurities 115 and p type impurities 118. This activation results in the formation of a third collector region 120 and a base region 125. The base region 125 is formed in an upper portion of the semiconductor substrate/second collector region 100 and the third collector region 120 is formed between the base region 125 (and contacts the bottom of the base region 125) and the semiconductor substrate/second collector region 100.

The third collector region 120 has a retrograde doping profile. In this doping profile, the impurity concentration of the portion contacting the base region 125 is higher than the remainder of the third collector region 120. In one aspect of the invention, the third collector region 120 may have an impurity concentration ranging from about $10^{14}$ atoms/cm³ to about $10^{17}$ atoms/cm³, while the base region 125 may have impurity concentration ranging from about $10^{14}$ atoms/cm³ to about $10^{18}$/atoms/cm³. From the portion near the base region, the impurity concentration of the third collector region 120 gradually decreases as it approaches the semiconductor substrate/second collector region 100. As the third collector region 120 nears the second collection region 100, the impurity concentration becomes substantially the same as the impurity concentration of semiconductor substrate/second collector region 100. Atthe same time, the impurity concentration of the third collector region 120 is higher than the impurity concentration of the second collector region 100 and lower than the impurity concentration of the first collector region 110.

Figure 2D:
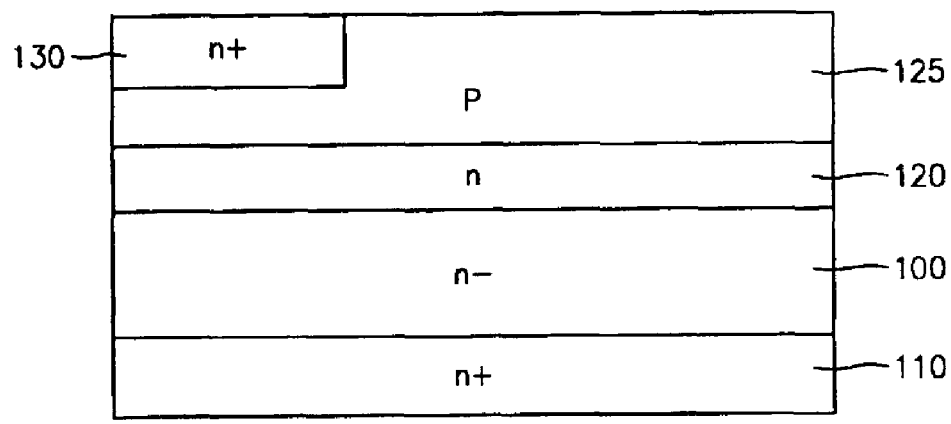

Next, as shown in FIG. 2D, n⁺ type impurities are implanted into a portion of the base region 125 and then activated to form an emitter region 130. In one aspect of the invention, the emitter region 130 has impurity concentration ranging from about $10^{17}$ atoms/cm³ to about $10^{20}$ atoms/cm³.

After the formation of the emitter region 130 (as shown in FIG. 2D), an insulating layer 135 is formed on the resulting structure that contains the base region 125 and the emitter region 130. The insulating layer 135 is then partially etched to expose predetermined portions of the base region 125 and the emitter region 130. Next, a base electrode 140B and an emitter electrode 140E are formed to contact the exposed portions of the base region 125 and the emitter region 130. Finally, a collector electrode 140C is formed to contact the first collector region 110 using any method known in the art.

Figure 2E:
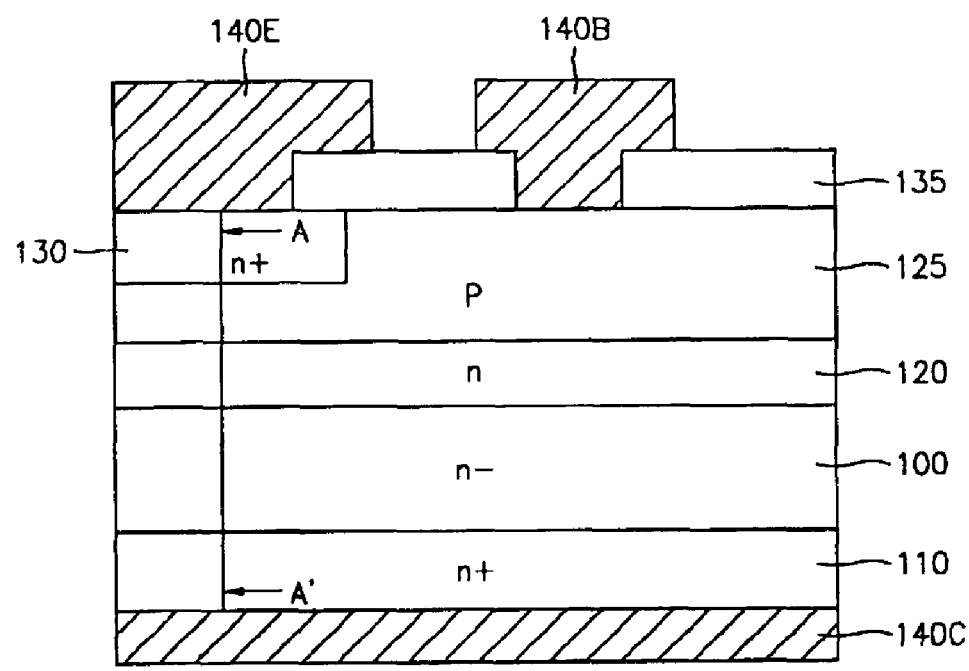
Figure 3:
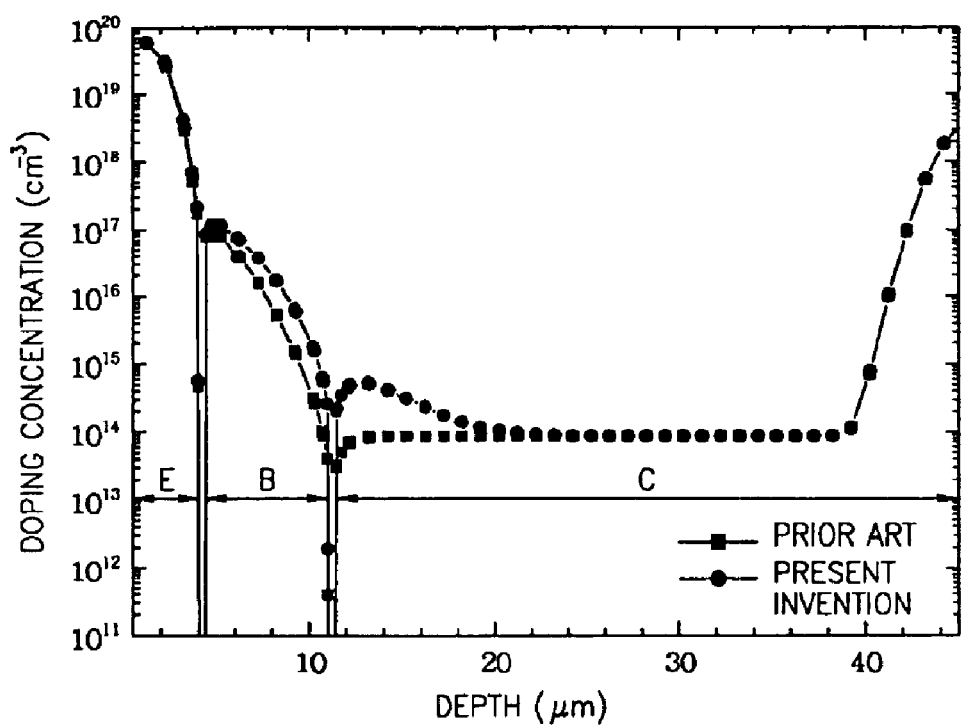
FIG. 3 is a graph illustrating a variation in a doping profile of a bipolar transistor of FIG. 2E in one aspect of the present invention, taken along the line A–A'.

The dopant profile of a bipolar transistor according to one aspect of the present invention is compared to conventional bipolar transistors in FIG. 3. FIG. 3 illustrates variations in the doping concentrations of the bipolar transistors as a function of the depth of the device. Referring to FIG. 3 and FIG. 2E, "E" denotes the emitter region 130, "B" denotes the base region 125, and "C" denotes collector regions 120, 100, and 110. In a conventional bipolar transistor, the collector region C contacting the base region B contains an $n^-$ type impurity doped region that has low impurity concentration. In the bipolar transistor according to the present invention, however, the collector region C contacting the base region 125 has slightly higher impurity concentration because of the presence of the third collector region 120. Therefore, when a high current is injected into the bipolar transistor according to the present invention, it is possible to reduce extension of the base region B to the collector region C.

As described above, and as shown in FIG. 3, the impurity of the third collector region 120 gradually decreases from the lower portion of the base region 125 and continues to decrease as the third collector region 120 approaches the second collector region 100. The formation of the third collector region 120, therefore, results in a retrograde doping profile of the collector regions 120, 110, and 100 below the base region 125.

In one aspect of the invention, the impurity concentrations of the base region 125, the emitter region 130, and the first collector region 110 (which contact the base electrode 140B, the emitter electrode 140E, and the collector electrode 140C, respectively) increase as these regions approach their respective electrodes. In this configuration, the contact resistance can be reduced.

Figure 4:
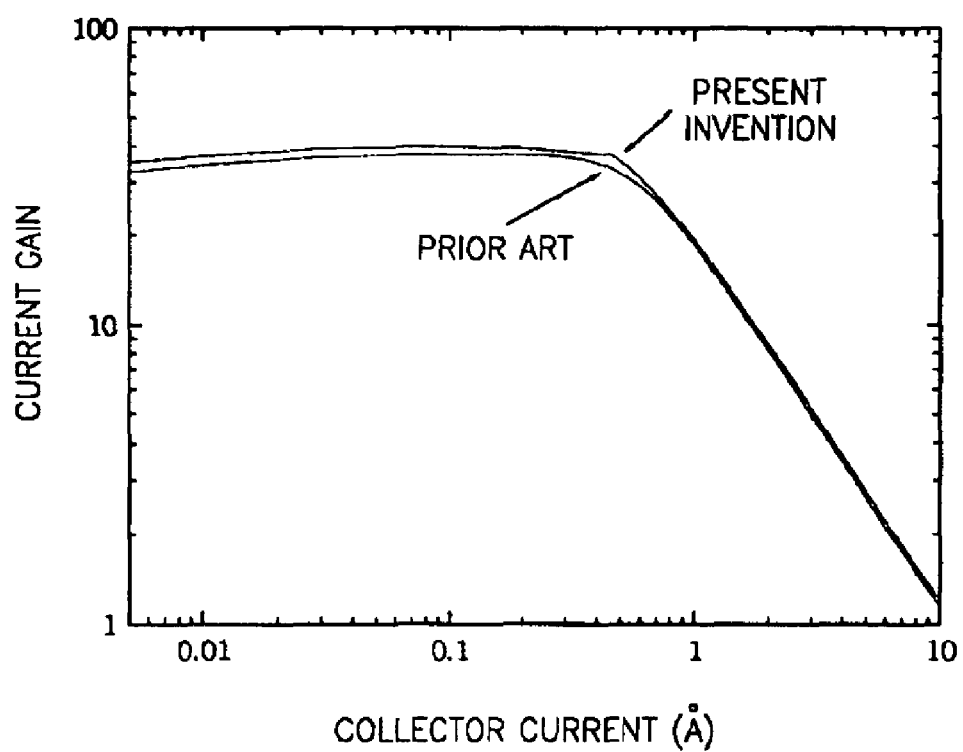
FIG. 4 is a graph illustrating a variation in a current gain of a bipolar transistor according to one aspect of the present invention.

FIG. 4 illustrates the variation in a current gain with respect to a collector current according to a bipolar transistor of the present invention and a conventional bipolar transistor. The formation of the third collector region 120 below the base region 125 prevents the base region 125 from extending to the second collector region 100, thereby reducing the base current $I_b$. Therefore, a current gain of the bipolar transistor according to the present invention is higher than that of a conventional bipolar transistor.

The bipolar transistors of the present invention have additional advantages. A simulation revealed that bipolar transistor according to the present invention had a storage time of 1.27 $\mu$s while a conventional bipolar transistor had a storage time of 1.32 $\mu$s. Also, a bipolar transistor according to the present invention had a falling time of 179 ns while a conventional bipolar transistor had a falling time of 190 ns. That is, the switching characteristics of the bipolar transistor according to the present invention were better than those of a conventional bipolar transistor.

As compared to a conventional bipolar transistor, the bipolar transistors according to the present invention contain the third collector region 120, which is an n type impurity region, below the base region 125. The impurity concentration of the third collector region 120 is higher than that of the second collector region 100, which is an $n^-$ type impurity region. When a high current is input into the bipolar transistor, it is possible to prevent the base region 125 from extending to the second collector region 100 because an extension surface of the base region 125 is covered with the third collector region 120 which has a high impurity concentration. For this reason, regardless of the injection of a high current, the capability of driving a current of the bipolar transistor of the present invention can be improved and the injection of holes from the base region B can also be reduced.

As described above, the occurrence of the Kirk effect that a base region extends toward a collector region due to the injection of a high current can be prevented, thereby suppressing a reduction in a current gain and the switching characteristics of the bipolar transistor of the present invention.

While this invention has been particularly shown and described with reference to preferred aspects thereof, it will be understood by those skilled in the art that various changes in form and details may be made therein without departing from the spirit and scope of the invention as defined by the appended claims.

What is claimed is:

1. A bipolar transistor comprising:
    a first collector region of a first conductive type having high impurity concentration;
    a second collector region of a first conductive type having high impurity concentration, the second collection region formed on the first collector region;
    a base region of a second conductive type being formed in a predetermined portion of the second collector region; and
    an emitter region of a first conductive type being formed in the base region;
    wherein a third collector region is further formed between the base region and the second collector region, the third collector region having an impurity concentration at an interface with the base region higher than the remainder of the third collector region.

2. The bipolar transistor of claim 1, wherein the impurity concentration of the third collector region gradually decreases as the third collector region more closely approaches the second collector region.

3. The bipolar transistor of claim 1, wherein the third collector region has lower impurity concentration than the first collector region.

4. The bipolar transistor of claim 1, wherein the first collector region has impurity concentration from $10^{14}/cm^3$ to $10^{20}/cm^3$.

5. The bipolar transistor of claim 1, wherein the second collector region has impurity concentration from $10^{13}/cm^3$ to $10^{16}/cm^3$.

6. The bipolar transistor of claim 1, wherein the third collector region has impurity concentration from $10^{14}/cm^3$ to $10^{17}/cm^3$.

7. The bipolar transistor of claim 1, further comprising:
    a base electrode being formed in a predetermined portion of the base region so as to contact the base region;
    an emitter electrode being formed in a predetermined portion of the emitter region so as to contact the emitter region; and
    a collector electrode being formed at the bottom of the first collector region.

8. The bipolar transistor of claim 1, wherein the impurity concentrations of the base region, the emitter region, and the first collector region gradually increase toward an interface between the base region and the base electrode, an interface between the emitter region and the emitter electrode, and an interface between the collector region and the collector electrode, respectively.

9. The bipolar transistor of claim 1, wherein the first conductive type is an n type and the second conductive type is a p type.

10. The bipolar transistor of claim 9, wherein impurities of the first conductive type are phosphorous ions and impurities of the second conductive type are boron ions.

11. A method of manufacturing a bipolar transistor, comprising:

forming a high-concentration first collector region of a first conductive type at the bottom of a semiconductor substrate that is doped with low-concentration impurities of a first conductive type, thereby defining a second collector region on the semiconductor substrate on the first collector region;

implanting at least one of first conductive impurities for a third collector region and second conductive impurities for a base region into the second collector region;

activating the first conductive impurities for the third collector region and the second conductive impurities for the base region, thereby forming the base region and the third collector region below the base region; and forming an emitter region in the base region;

wherein the third collector region has higher impurity concentration at an interface with the base region than the remainder of the third collector region.

12. The method of claim 11, wherein the first conductive impurities are ion-implanted into the third collector region, so that the third collector region has lower impurity concentration than the first collector region.

13. The method of claim 11, wherein the first collector region and the emitter region are obtained by ion-implanting corresponding impurities into the first collector region and the emitter region and activating the implanted impurities, respectively.

14. The method of claim 11, after forming the emitter region, further comprising:

depositing an insulating layer on the semiconductor substrate on which the base region and the emitter region are formed;

partially etching the insulating layer to expose predetermined portions of the base region and the emitter region;

forming a base electrode and an emitter electrode on the exposed portions of the based region and the emitter region; and forming a collector electrode at the first collector region.

15. The method of claim 11, wherein the first conductive type is an n type and the second conductive type is a p type.

16. The method of claim 11, wherein the first conductive impurities are phosphorous ions and the second conductive impurities are boron ions.

17. A bipolar transistor, comprising:

a first collector region having a first concentration of a first conductive type;

a second collector region having a second concentration of a first conductive type and formed on the first collector region;

a third collector region having a third concentration of a first conductive type and formed on the second collector region;

a base region formed on a portion of the third collector region; and an emitter region formed on a portion of the base region;

wherein the third concentration is higher at an interface with the base region than the remainder of the third collector region.

18. The bipolar transistor of claim 17, wherein the third concentration decreases from the base region to the second collector region.

19. The bipolar transistor of claim 17, wherein the third concentration is lower than the first concentration.

20. The bipolar transistor of claim 17, further comprising:

a base electrode contacting a portion of the base region;

an emitter electrode contacting a portion of the emitter region; and a collector electrode contacting a portion of the first collector region.

21. The bipolar transistor of claim 17, wherein the first conductive type is an n type and the second conductive type is a p type.

22. A collector for a bipolar transistor, comprising:

a first collector region having a first impurity concentration of a first conductive type;

a second collector region having a second impurity concentration of a first conductive type and formed on the first collector region; and a third collector region having a third impurity concentration of a first conductive type and formed on the second collector region, wherein the third impurity concentration is highest at a portion of the third collector region furthest from the second collector region.

23. The bipolar transistor of claim 22, wherein the third concentration decreases from the said furthest portion to the second collector region.

24. A method for making a bipolar transistor, the method comprising:

providing a first collector region having a first concentration of a first conductive type;

providing a second collector region having a second concentration of a first conductive type and formed on the first collector region;

providing a third collector region having a third concentration of a first conductive type and formed on the second collector region;

providing a base region formed on a portion of the third collector region; and providing an emitter region formed on a portion of the base region;

wherein the third concentration is higher at an interface with the base region than the remainder of the third collector region.

25. The method of claim 24, wherein the third concentration decreases from the base region to the second collector region.

26. A method for making a collector of bipolar transistor, the method comprising:

providing a first collector region having a first concentration of a first conductive type;

providing a second collector region having a second concentration of a first conductive type and formed on the first collector region; and providing a third collector region having a third concentration of a first conductive type and formed on the second collector region, wherein the third concentration is highest at the portion of the third collector region furthest from the second collector region.

* * * * *